(12) United States Patent
Van Blerkom

(10) Patent No.: US 11,722,145 B2
(45) Date of Patent: *Aug. 8, 2023

(54) DUAL RESET BRANCH ANALOG TO DIGITAL CONVERSION COMPRISING A FIRST SIDE BRANCH AND A PLURALITY OF SECOND SIDE BRANCHES

(71) Applicant: Forza Silicon Corporation, Pasadena, CA (US)

(72) Inventor: Daniel Van Blerkom, Altadena, CA (US)

(73) Assignee: Forza Silicon Corporation, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/378,532

(22) Filed: Apr. 8, 2019

(65) Prior Publication Data
US 2019/0238148 A1    Aug. 1, 2019

Related U.S. Application Data

(63) Continuation of application No. 14/162,726, filed on Jan. 23, 2014, now Pat. No. 10,256,833.
(Continued)

(51) Int. Cl.
*H03M 1/80* (2006.01)
*H03M 1/12* (2006.01)
(Continued)

(52) U.S. Cl.
CPC ......... *H03M 1/1215* (2013.01); *H03M 1/122* (2013.01); *H03M 1/123* (2013.01);
(Continued)

(58) Field of Classification Search
CPC ...... H03M 1/40; H03M 1/462; H03M 1/1205; H03M 1/403; H03M 1/38; H03M 1/464;
(Continued)

(56) References Cited

U.S. PATENT DOCUMENTS 5,954,816 A * 9/1999 Tran .................... G06F 9/30054
712/239
9,531,400 B1 * 12/2016 Wen ........................ H03M 1/38
(Continued)

*Primary Examiner* — Que Tan Le
(74) *Attorney, Agent, or Firm* — Haug Partners LLP

(57) ABSTRACT

Methods and systems for analog-to-digital conversion using two side branches that may be operated with overlapped timing such that a sampling phase may be overlapped with a previous conversion phase. Some embodiments provide a method of successive approximation A/D converting, comprising sampling a first signal onto a first capacitor that is configured to selectively couple to an analog input of a comparator, sampling a second signal onto capacitors that are coupled to a second analog input of the comparator and configured for charge redistribution successive approximation A/D conversion; carrying out, based on the first signal and the second signal, a charge redistribution successive approximation A/D conversion using the capacitors; and while carrying out the charge redistribution successive approximation A/D conversion based on the first and second signals, sampling a third signal onto a third capacitor that is configured to selectively couple to the analog input of a comparator.

5 Claims, 6 Drawing Sheets

Related U.S. Application Data

(60) Provisional application No. 61/755,824, filed on Jan. 23, 2013.

(51) Int. Cl.
    *H03M 1/38*     (2006.01)
    *H03M 1/40*     (2006.01)
    *H03M 1/46*     (2006.01)

(52) U.S. Cl.
    CPC ........... *H03M 1/1205* (2013.01); *H03M 1/38* (2013.01); *H03M 1/40* (2013.01); *H03M 1/403* (2013.01); *H03M 1/46* (2013.01); *H03M 1/462* (2013.01); *H03M 1/464* (2013.01); *H03M 1/466* (2013.01); *H03M 1/468* (2013.01)

(58) Field of Classification Search
    CPC ...... H03M 1/46; H03M 1/123; H03M 1/1215; H03M 1/122; H03M 1/466; H03M 1/468; H03M 1/108; H03M 1/80; H03M 1/68
    USPC .......................................... 250/208.1, 214 R
    See application file for complete search history.

(56) References Cited

U.S. PATENT DOCUMENTS

2004/0246160 A1* 12/2004 Leung ................. H03M 1/1057 341/172
2006/0244855 A1* 11/2006 Bock ..................... H04N 3/155 348/E3.018

* cited by examiner

DUAL RESET BRANCH ANALOG TO DIGITAL CONVERSION COMPRISING A FIRST SIDE BRANCH AND A PLURALITY OF SECOND SIDE BRANCHES

RELATED APPLICATIONS

This application is a continuation of U.S. application Ser. No. 14/162,726, filed Jan. 23, 2014, which claims the benefit of U.S. Provisional Application No. 61/755,824, filed Jan. 23, 2013, which are each hereby incorporated herein by reference in their entirety.

BACKGROUND

The present disclosure relates to analog-to-digital conversion and, more particularly, some embodiments relate analog-to-digital conversion that is well-suited for image sensor readout circuitry, such as image sensor readout circuitry that includes column-parallel analog-to-digital converters (ADCs).

To provide an illustrative practical context, this background discussion relates to CMOS image sensors; however, it will be understood that ADCs in accordance with the present disclosure are not limited to image sensor readout applications, and may be implemented in myriad applications.

The readout of a pixel in a CMOS image sensor requires reading two levels—the reset level and the signal level. Depending on the architecture of the image sensor, the reset level may come before or after the signal level in time. The final pixel value is determined by differencing the signal level and the reset level. This differential result eliminates the pixel-to-pixel variations in the absolute voltage offsets of the reset-level. If the pixel is 4T-type, the reset kTC noise will also be eliminated by the differencing; this is called correlated double sampling (CDS).

As sensor frame rates and resolutions increase, the row time must decrease. The row time comprises the row-wise pixel readout into column sample and hold capacitors (sample reset and sample signal), followed by an ADC conversion, as shown in FIG. 1. It becomes more and more difficult to shrink the times for the pixel readout and ADC conversion, to support shorter row times. Shrinking the pixel readout requires faster settling from the pixel outputs, which requires more power. This is further complicated by increased sensor resolution, which increases the amount of parasitic capacitance on the pixel output lines, increasing the settling time. Shrinking the ADC conversion time also requires increasing the power and area required.

One approach is to pipeline the pixel readout and ADC conversion so that each operation can use a full row time to finish, by, for example, ping-ponging between two ADCs that run at half the row-rate. This approach is expensive in terms of area, due to the duplication of the circuitry, and may effectively preclude or limit the use of certain ADC designs because of chip area limitations. In addition, differences between components of the ping-ponged ADCs (e.g., comparator characteristics; binary weighted capacitor matching for SAR ADCs) can lead to offsets between the ping-ponged ADCs.

BRIEF DESCRIPTION OF THE DRAWINGS

Aspects, features, and advantages of some embodiments of the invention, both as to structure and operation, will be understood and will become more readily apparent in view of the following description of non-limiting and non-exclusive embodiments in conjunction with the accompanying drawings, in which like reference numerals designate the same or similar parts throughout the various figures, and wherein.

SUMMARY OF ILLUSTRATIVE EMBODIMENTS

Figure 1:
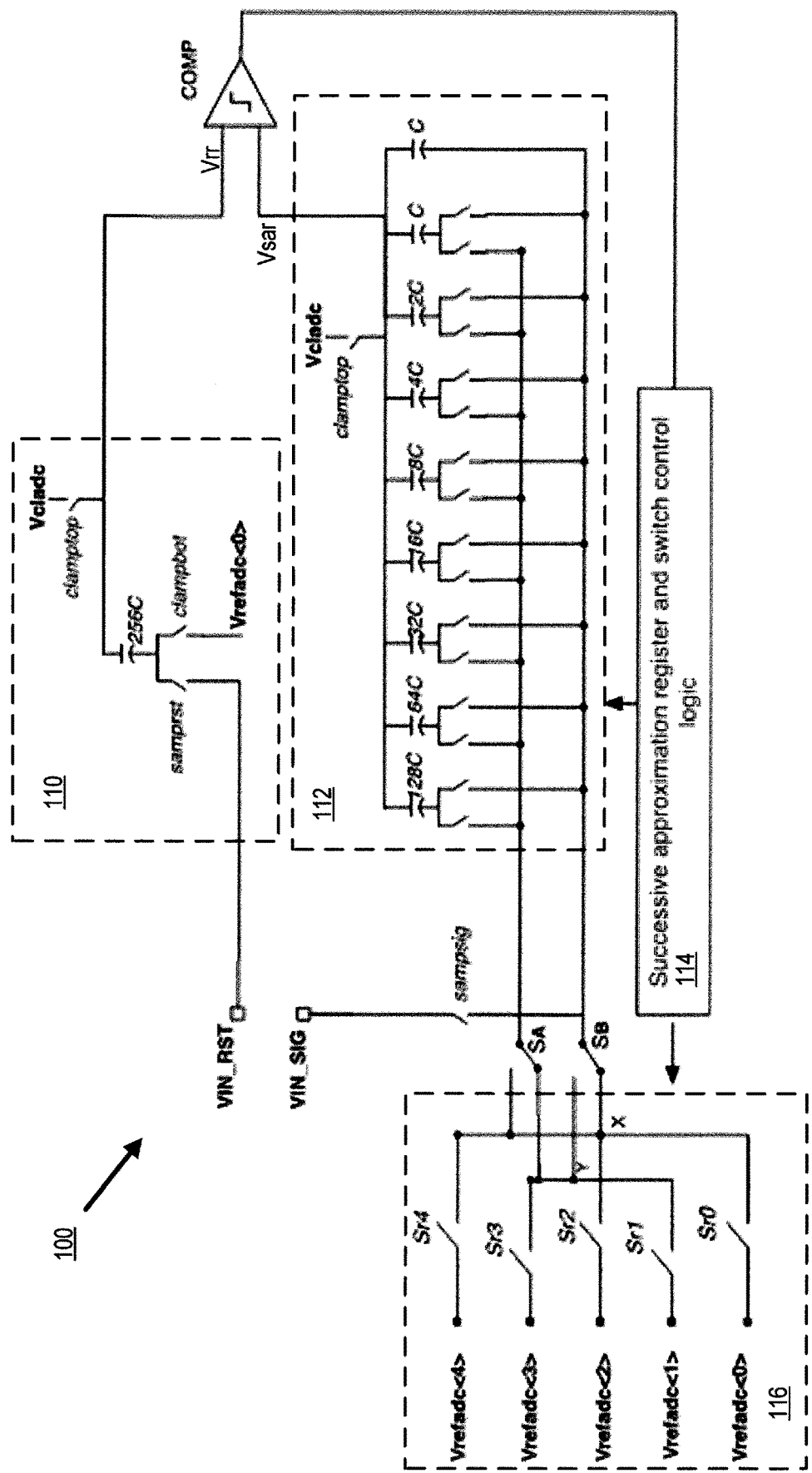
FIG. 1 depicts, for purposes of comparison with some embodiments of the present disclosure, an illustrative single-ended SAR ADC implementation that includes various features that may be implemented in accordance with embodiments of the present disclosure, but that does not include dual reset-side sampling as does various embodiments of the present disclosure.

In some embodiments of the present disclosure, an ADC is provided wherein, instead of duplicating the entire ADC structure, only a portion of the ADC structure is duplicated to provide for pipelined operation of at least some portion of the analog-to-digital conversion process effected by the ADC. For example, in some embodiments, only the reset-side branch is duplicated.

Some embodiments of the present disclosure provide methods and systems for analog-to-digital conversion using two reset-side branches that may be operated with overlapped timing such that a reset sampling phase may be overlapped with a previous conversion phase, enabling higher speed operation of the ADC (e.g., compared to the ADC employing a single reset-side branch). Some embodiments provide a successive-approximation-register (SAR) analog-to-digital converter (ADC) architecture having two reset-side branches and a single signal-side branch, and various embodiments may include other ADC architectures in which two reset-side branches may be provided, such as single-slope ADCs. Some embodiments relate to an image sensor, such as a CMOS image sensor, that includes an ADC having dual reset-side branches.

An illustrative successive approximation register (SAR) ADC embodiment comprises a comparator having a first input and a second input; a single signal-side branch configured to sample a signal-voltage input thereto, and comprising a binary-weighted capacitor array and an output coupled to the first input of the comparator; two reset-side branches, each reset-side branch configured to sample a respective voltage and having a respective output; and wherein the SAR ADC is configured to selectively couple each of the outputs of the reset-side branches separately to the second input of the comparator.

It will be appreciated by those skilled in the art that the foregoing brief description and the following description with respect to the drawings are illustrative and explanatory of some embodiments of the present invention, and are neither representative nor inclusive of all subject matter and embodiments within the scope of the present invention, nor intended to be restrictive or characterizing of the present invention or limiting of the advantages which can be achieved by embodiments of the present invention, nor intended to require that the present invention necessarily provide one or more of the advantages described herein with respect to some embodiments. Thus, the accompanying drawings, referred to herein and constituting a part hereof, illustrate some embodiments of the invention, and, together with the detailed description, serve to explain principles of some embodiments of the invention.

DESCRIPTION OF ILLUSTRATIVE EMBODIMENTS

Throughout the description and claims, the following terms take at least the meanings explicitly associated herein, unless the context dictates otherwise. The meanings identified below do not necessarily limit the terms, but merely provide illustrative examples for the terms. The phrase "an embodiment" as used herein does not necessarily refer to the same embodiment, though it may. In addition, the meaning of "a," "an," and "the" include plural references; thus, for example, "an embodiment" is not limited to a single embodiment but refers to one or more embodiments. Similarly, the phrase "one embodiment" does not necessarily refer the same embodiment and is not limited to a single embodiment. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise.

In addition, as used herein, unless the context clearly dictates otherwise, the term "coupled" refers to directly connected or to indirectly connected through one or more intermediate components and, in some contexts, may also denote or include electrically coupled, such as conductively coupled, capacitively coupled, and/or inductively coupled. Further, "conductively coupled" refers to being coupled via one or more intermediate components that permit energy transfer via conduction current, which is capable of including direct current as well as alternating current, while "capacitively coupled" refers to being electrostatically coupled through one or more dielectric media, and possibly also via one or more intervening conductors (e.g., via a series of capacitive components), that permit energy transfer via displacement current and not via direct current. Those skilled in the art will further understand that elements may be capacitively coupled intentionally or unintentionally (e.g., parasitically) and that in some contexts, elements said to be capacitively coupled may refer to intentional capacitive coupling. In addition, those skilled in the art will also understand that in some contexts the term "coupled" may refer to operative coupling, through direct and/or indirect connection. For instance, a conductor (e.g., control line) said to be coupled to the gate of a transistor may refer to the conductor being operable to control the gate potential so as to control the operation of the transistor (e.g., switching the transistor between "on" and "off" states), regardless of whether the conductor is connected to the gate indirectly (e.g., via another transistor, etc.) and/or directly.

Briefly, the ensuing disclosure describes an embodiment of an illustrative implementation of dual reset-side sampling for a SAR ADC and describes the overlapping timing it supports. First, the structure and operation of a single-ended SAR ADC implementation without dual reset-side sampling is described. Then, an illustrative dual reset-side sampling SAR ADC implementation according to some embodiments of the present invention is described. It is noted that because some embodiments of the present invention are well-suited for image sensor applications in which an ADC may effect correlated double sampling (CDS) by comparing a signal corresponding to the pixel signal level relative to the pixel reset level, illustrative embodiments presented herein are described with respect to image sensor readout timing (e.g., FIGS. 2B, 3, 4) and also employ certain terminology used in such a context (e.g., "reset branch," and similar "reset" related terms).

It will be understood, however, that such image sensor related terminology (e.g., "reset side," "reset-side sample," reset level, and similar terms or variants thereof referring to a "reset") is not intended to limit embodiments of the present disclosure to an ADC implemented in an image sensor. For example, it will be understood from the present disclosure that such "reset" terms refer to a voltage sample and/or associated circuit branch that may be coupled (directly or indirectly) to an input of a comparator having another input that may be coupled to circuitry that samples another signal. In other words, the reset branch (or reset sample, etc.) is not limited to being associated with a reset level of an image sensor pixel. And, in this respect, the term "reset" (or "reset-side" and similar terms or variants thereof referring to "reset") and the term "signal-side" (and similar terms or variants thereof referring to the "signal," in contrast to the "reset") may be understood, in the context of various embodiments (e.g., of an SAR ADC), as nomenclature used to distinguish between two signal paths (e.g., branches) that may be respectively coupled to the two analog inputs of a comparator.

It will also be understood that embodiments of the present disclosure are not limited to SAR ADCs but may include other ADC types (e.g., single-slope ADC) that may include an additional reset-side branch to provide for sampling— while using a reset voltage level in converting an analog signal sample to a digital output value—a subsequent reset voltage level to be used by the ADC in converting a subsequent analog signal sample.

An illustrative single-ended SAR ADC implementation, without dual reset-side sampling, is schematically shown in FIG. 1 in block diagram form. More specifically, as shown, SAR ADC 100 is implemented as a hybrid ADC, including subranging conversion circuitry 116 to resolve two coarse bits (i.e., the two most significant bits (MSBs)), and charge redistribution successive approximation conversion circuitry comprising binary weighted capacitor bank 112 to resolve eight fine bits (i.e., the 8 least significant bits (LSBs)), as further described below.

The "top" plates of capacitor bank 112 are (i) selectively coupled via switch clamptop to common voltage Vcladc, and (ii) coupled to an analog input of comparator COMP (providing signal Vsar thereto). The "bottom" plates of each of the eight bit-resolving capacitors of capacitor bank 112 are selectively switchable between two voltage references, Vrefadc<n> and Vrefadc<n+1>, selected from among voltage references Vrefadc<n> (n=0, 1, 2, 3, 4), as determined based on subranging conversion circuitry 116 and selectively provided according to switches SA, SB, Sr0, Sr1, Sr2, Sr3, Sr4. These bottom plates are also selectively switchable to be selectively coupled via switch sampsig to signal VIN_SIG (e.g., corresponding to pixel signal).

The other analog input of comparator COMP is coupled to reset-side branch circuitry 110, which provides signal Vrr from the top plate of a capacitor (shown having magnitude 256C, matching the parallel capacitance of capacitor bank 112). The top plate of this capacitor is selectively coupled to common voltage Vcladc via switch clamptop (for ease of reference, a switch and its control signal are identified herein by a common reference character; as such, two switches driven by the same control signal may be referred to by the same reference character). The bottom plate of this capacitor is (i) selectively coupled via switch samprst to selectively sample the signal VIN_RST (e.g., corresponding to pixel reset signal), and (ii) selectively coupled via switch clampbot to voltage reference Vrefadc<O>.

SAR and switch control logic 114, which receives the binary output of comparator COMP, controls operation and switch timing of SAR ADC 100, including capacitor bank 112, reset branch 110, subranging conversion circuitry 116, and switches SA, SB, and sampsing.

As configured in this particular illustrative example of FIG. 1 (and in the similarly configured illustrative embodiment of FIG. 3, discussed below), the inputs VIN_SIG and VIN_RST are sampled onto the bottom plates of the capacitor banks. During sampling, the top plates of the capacitor bank 112 capacitors and the reset branch 110 capacitor are clamped to the common voltage Vcladc by closing the clamptop switches, during which closure the comparator COMP can be auto-zeroed to eliminate its offset.

After sampling the inputs VIN_SIG and VIN_RST, the top plate clamp switches (clamptop switches) are opened. The reset-side capacitor bottom plate is then driven to the Vrefadc<0> reference level, and all of the signal-side capacitor bottom plates are switched between the other Vrefadc[n] levels in a binary search, to find the adjacent pair of Vrefadc references that bound the input signal. Once this pair of references has been determined, the binary-scaled capacitor array is switched, one capacitor at a time, between the two reference levels, in the typical successive approximation timing. The final digital value consists of two components: "coarse" bits which represent which pair of Vrefadc references were chosen as bounding the input signal, and "fine" bits as determined from the successive approximation operation on the binary weighted capacitor array.

Note that the coarse operation described here in accordance with the hybrid conversion configuration (provided by subranging conversion circuitry 116 and the related switch control logic implemented in SAR and switch control logic 114) is optional. For instance, some embodiments may include subranging conversion circuitry 116 but optionally employ subranging conversion based on a host selection signal provided to SAR logic 114; e.g., the host selection signal may indicate that subranging conversion should not be employed and that a specific pair of voltage references Vrefadc<n> (n=0, 1, 2, 3, 4) should be used. Some embodiments may not include subranging conversion circuitry; that is, SAR ADC 100 could be simplified to always use a fixed pair of Vrefadc references, e.g., Vrefadc[1] and Vrefadc[0], for successive approximation D/A conversion by the capacitor bank 112.

It is further noted that the coarse/fine implementation of a SAR ADC, employing a subranging classifier similar to subranging classifier 116, is further disclosed in commonly assigned U.S. patent application Ser. No. 13/656,674, entitled "Segmented Column-Parallel Analog-to-Digital Converter," which is hereby incorporated herein in its entirety. As disclosed therein, for example, in some embodiments consecutive voltage references Vrefadc<n> (n=0, 1, 2, 3, 4) may be selected non-linearly, which can provide improved resolution. (e.g., the voltages may be selected such that each successive segment doubles in least-significant-bit (LSB) size). It will be understood, however, that in various embodiments, any monotically increasing voltage references may be selected, including linearly increasing. In addition, subranging classifier 116 may be implemented in alternative ways, such as by using a flash conversion technique (e.g., employing multiple comparators in parallel). Further, in various embodiments, a different number of coarse bits may be provided by subranging classifier 116 (e.g., 3 most significant bits (MSBs), corresponding to eight segments provided by voltage references Vrefadc<n> (n=0, 1, 2, 3, 4, 5, 6, 7, 8).

Figure 2A:
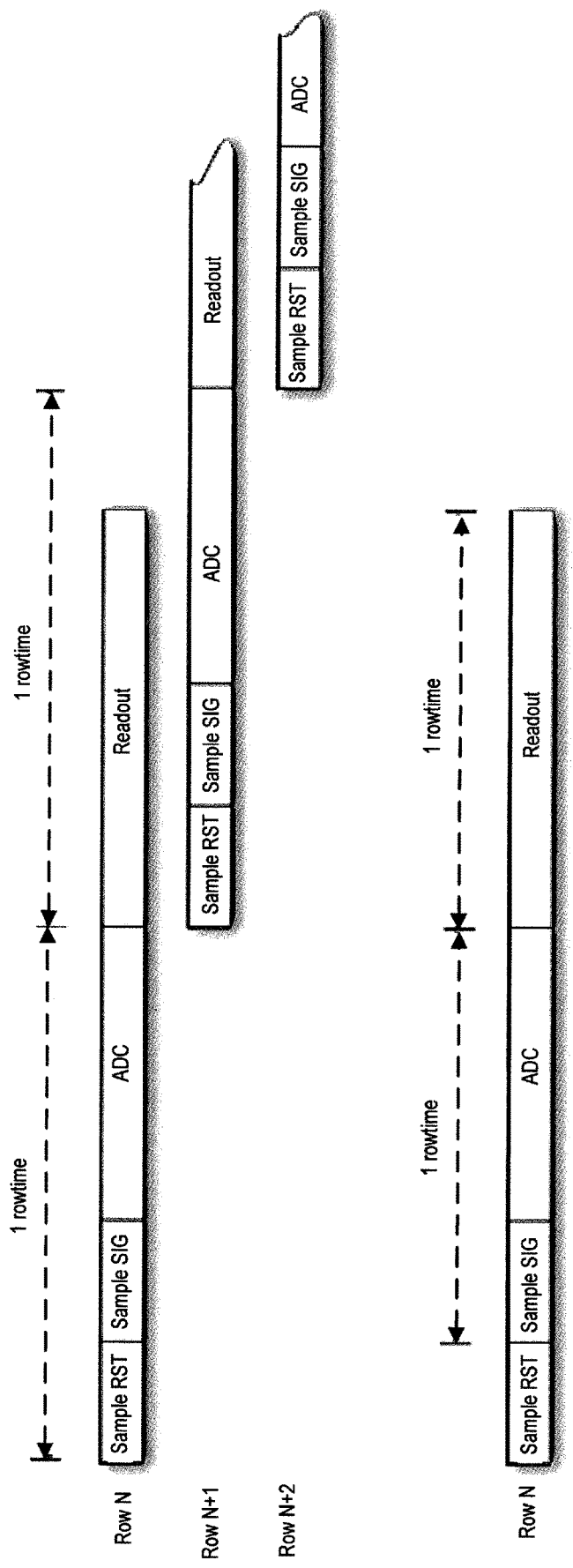
FIG. 2A depicts illustrative timing for the operation of the SAR ADC of FIG. 1.

FIG. 2A depicts illustrative timing for the operation of the SAR ADC of FIG. 1 with respect to sampling the reset (RST) and signal (SG) levels, A/D conversion, and readout of pixels in three consecutive rows (i.e., rows N, N+1, and N+2) of an image sensor. As can be seen, the SAR ADC cannot sample the reset level for the pixel of a subsequent row until conversion for the pixel of the previous row is completed.

Figure 3:
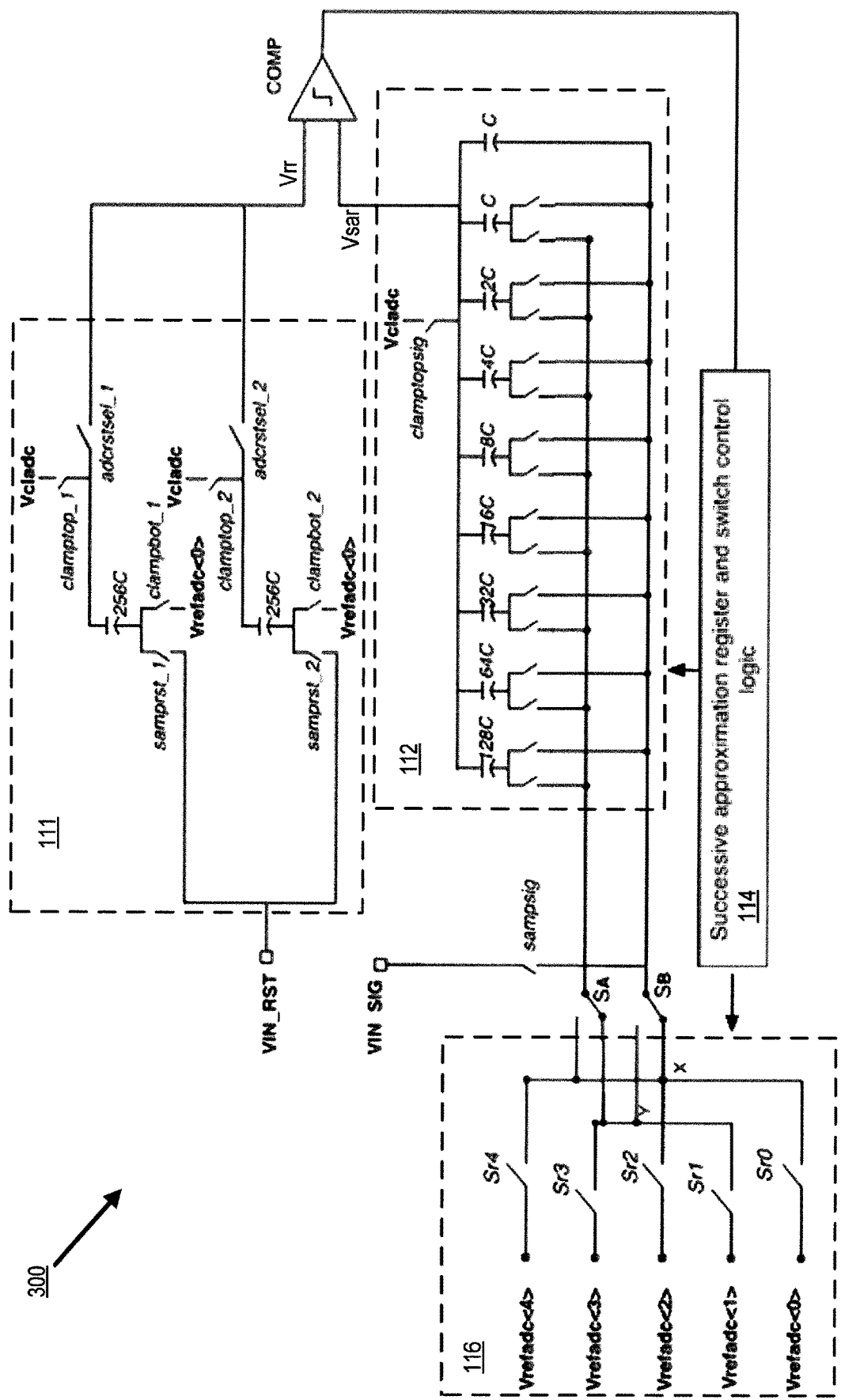
FIG. 3 shows an illustrative single-ended SAR ADC implementation with dual reset branches, in accordance with some embodiments.

FIG. 3 shows an illustrative single-ended SAR ADC 300 implementation with dual reset branches, in accordance with some embodiments of the present invention. As shown, the architecture is similar to that of FIG. 1, discussed above. Also, as will be understood from the ensuing description, the operation of SAR ADC 300 is also similar, in many respects, to that of SAR ADC 100. And, in view of the ensuing description, modifications relative to SAR ADC 100 will be understood by those skilled in the art. Accordingly, for clarity of exposition, corresponding or similar components (e.g., having corresponding reference characters) and operations are not described in detail, and those skilled in the art will understand how the above description of SAR ADC 100, and various modifications thereof, are applicable to SAR ADC 300, as well as how SAR ADC 300 may be configured differently from SAR ADC 300, in accordance with various embodiments thereof.

As shown in FIG. 3, reset branch circuitry 111 includes dual reset branches that are configured to respectively sample VIN_RST and to respectively provide signal Vrr to an input of comparator COMP. More specifically, (i) the first reset-side branch includes switches samprst_1, clampbot_1, clamptop_1, and adcrstsel_1, and a capacitor (shown having magnitude 256C) coupled to each of these switches; and the second reset-side branch includes switches samprst_2, clampbot_2, clamptop_2, and adcrstsel_2, and a capacitor (shown having magnitude 256C) coupled to each of these switches. As will be understood, therefore, SAR and switch control logic 114 is similar to the identically referenced logic in FIG. 1 but is configured to appropriately control the dual reset branches in accordance with the operation described below.

Operation is similar to that of the SAR ADC 100 without dual reset branches described with reference to FIG. 1; however, in the SAR ADC 300 of FIG. 3, the sampling of the next reset level can occur simultaneously with the ADC converting the current signal. One of the reset branches is used in the current conversion, while the other is used to sample the next reset value. When conversion is complete, the ADC is immediately ready to sample the signal level, and the reset branch that was used in the (completed)

conversion is now available to sample the following reset level. In this manner, by ping-ponging between the reset branches, the row-time can be reduced by overlapping the reset sampling with ADC conversion.

Figure 2B:
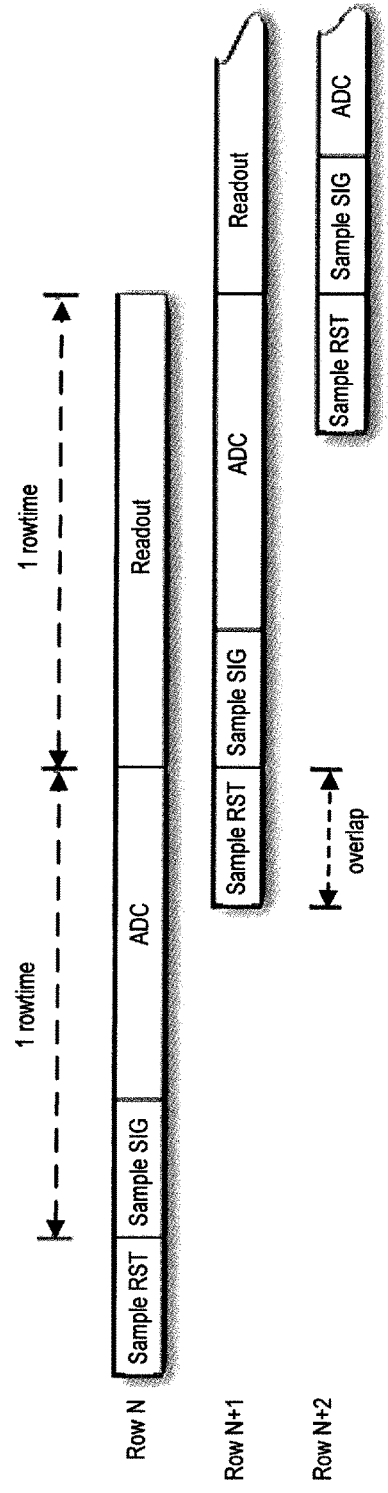
FIG. 2B depicts illustrative timing for the operation of the SAR ADC of FIG. 3, in accordance with some embodiments.
Figure 4:
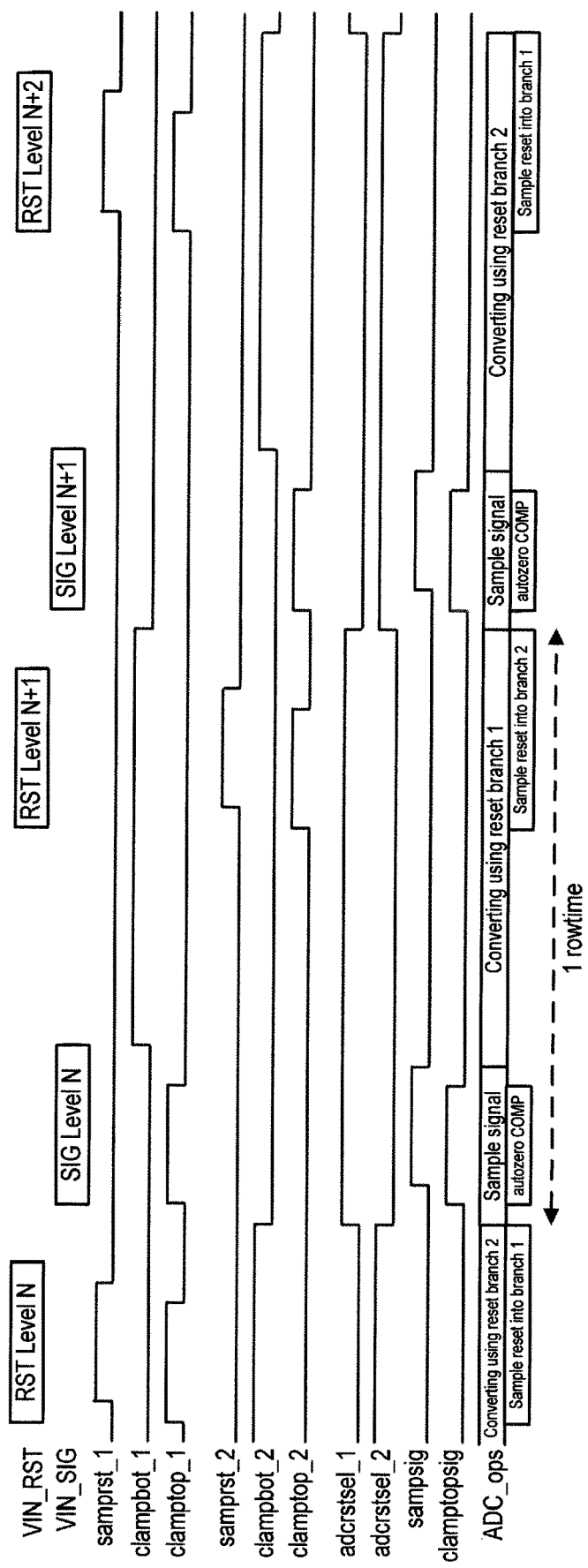
FIG. 4 shows a detailed illustrative timing diagram of ping-pong reset sampling, implemented in accordance with some embodiments such as the SAR ADC embodiment of FIG. 3.

This overlapping operation is illustrated in FIG. 2B, which depicts illustrative timing for the operation of the SAR ADC 300 of FIG. 3 with respect to sampling the reset (RST) and signal (SIG) levels, A/D conversion, and readout of pixels in three consecutive rows (i.e., rows N, N+1, and N+2) of an image sensor. As can be clearly seen by direct comparison to FIG. 2A, in accordance with the illustrative dual reset branch SAR ADC 300, the row time is shortened by the reset sampling time (Sample RST). A detailed illustrative timing diagram of the ping-pong reset sampling, implemented in accordance with some embodiments such as the hybrid SAR ADC 300 embodiment of FIG. 3 is shown in FIG. 4, which shows the operations being carried out by SAR ADC 300 (ADC_ops) as the control signals are applied according to the illustrative timing with respect to three consecutive reset signals (VIN_RST) RST Level N, RST Level N+1, RST Level N+2 and signals (VIN_SIG) SIG Level N, SIG Level N+1, corresponding to two of the reset signals.

Note that in some embodiments of an image sensor employing such a SAR ADC, the reset level being sampled may not be the actual reset level from the pixel. For example, if there is a switched capacitor programmable gain amplifier (PGA) prior to the ADC, the reset level may be the reset level of the PGA amplifier, instead of the pixel reset level itself. In fact, in some embodiments, the pixel may be read in a 3-T fashion, with signal level first, followed by the reset level. However, the same benefits of speeding up the row time still apply.

Accordingly, it may be understood that some embodiments of the present invention provide for various advantages and/or features. For example, some embodiments provide for a good balance between speed increase and the power and chip area impact. Speed may be increased without duplicating the entire ADC structure. As describe above, in some embodiments, only the reset-side branch may be duplicated, allowing the storage of the reset level to be ping-ponged between the two reset-side branches, and for this operation to overlap with the ADC conversion of the previous pixel sample. In addition, for some SAR ADC embodiments employing a dual reset-side branch and a single signal-side branch, since the same comparator and binary weighted capacitor bank is used for all conversions, any ping-pong artifacts due to mismatches are limited to the reset-side capacitor matching. Such mismatches may be compensated for by, for example, calibration (e.g., pre-calibration).

In addition, in view of the foregoing, it will also be understood by those skilled in the art that some image sensor readout embodiments (whether employing 3T, 4T, or other pixel circuit design) may be configured such that the pixel reset signal may be sampled by the binary-weighted capacitive bank (e.g., bank 112 in FIG. 3) and the pixel signal may be sampled by the so-called dual "reset" branch (e.g., the so-called "reset" branch circuit 111 in FIG. 3) that is coupled to the other input of the comparator COMP (i.e., the input that is not coupled to the binary-weighted capacitive array used for successive approximation charge redistribution). Such a configuration would still provide similar advantages; e.g., allowing the storage of the sample level to be ping-ponged between the two "reset"-side branches, and for this operation to overlap with the ADC conversion, with the pixel reset level being sample by the SAR capacitive array in between ADC conversions. For example, such a configuration may be advantageous in the case of slow pixel signal settling. As will be understood, such embodiments are consonant with the terms "reset" and "signal" branches being used, as discussed above, without limitation on the applicability of SAR ADC embodiments with respect to overlapping sampling and conversion operations, in accordance with the present disclosure.

Figure 5:
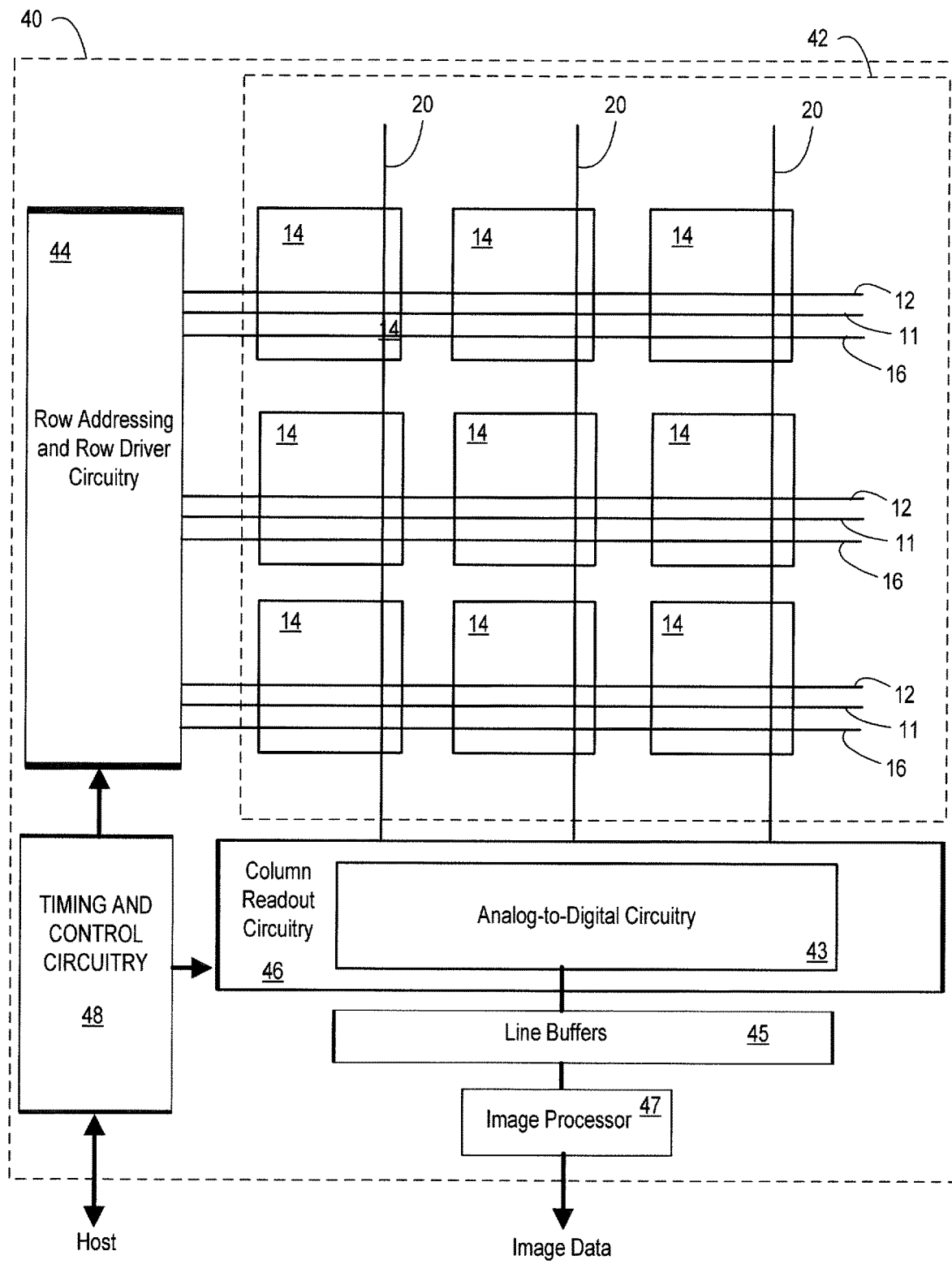
FIG. 5 depicts a block diagram of an illustrative CMOS image sensor architecture that may be used to implement some embodiments of the present disclosure.

FIG. 5 depicts a block diagram of an illustrative CMOS image sensor 40 architecture that may be used to implement embodiments in accordance with the present disclosure, such as embodiments in accordance with those described hereinabove in connection with FIGS. 2B, 3, and 4. As well known, pixel array 42 typically includes a large number of pixels arranged in an M×N array; however, CMOS image sensor 40 is shown as including a simplified pixel array 42 comprising a three by three array of pixels 14, which, for ease of discussion, is a 4T pixel circuit in this embodiment, but may be any of a variety of pixel circuit types, such as 3T. And, in some embodiments, the pixels may be shared pixels and may further be configured for in-pixel binning.

Row Addressing and Row Driver Circuitry 44 generates transfer gate control signals on lines 11, row select signals on lines 16, an reset gate control signals on lines 12. Column Readout Circuitry 46 includes analog-to-digital circuitry 43 for sampling and digitizing output values readout from the pixel array 42. Particularly, circuitry 43 may be implemented to comprise a plurality of A/D converters, each implemented in accordance with SAR ADC 300, configured to implement column-parallel readout. In some embodiments, the circuitry 43 may be configured such that the readout circuitry associated with each column bus 20 may have a respective analog-to-digital converter (ADC), though in some embodiments pairs of columns may share an ADC.

Timing and control circuitry 46 controls both the row addressing and row driver circuitry 44 and the column readout circuitry 43. For instance, timing and control circuitry controls the row addressing and row driver circuitry 44 for selecting the appropriate row for readout, and may provide timing control signals in accordance with logic 114 for SAR ADCs 300. As indicated in FIG. 4, timing and control circuitry 46 may also communicably interface with a host (e.g., a processor associated with a system comprising the image sensor), which may, for example, in some implementations, specify various control information.

As schematically depicted, signals on column buses 20 are sampled and digitized by circuitry 43, and the digitized pixel values provided by the SAR ADCs may be provided to line buffers 45, which may be used to temporarily store digital signals from circuitry 43 for use by image processor 47. In general, any number of line buffers 45 may be included and, for example, each line buffer may be capable of storing digital signals representative of the charge signals that may be read from each pixel in a given row of pixels in the pixel array 42. Image processor 47 may be used to process the digital signals held in line buffers 36 to produce output image data that may be provided to a device external to the image sensor 40.

As may be appreciated, there are many possible alternative implementations of an image sensor architecture that may embody a dual reset branch ADC in accordance with some embodiments of the present disclosure. By way of example, it will be understood that circuitry 46 may be divided into two portions provided at the top and bottom of the pixels array.

Illustrative Example

The following example is provided to illustrate some embodiments of the present invention as well as various features and advantages that may be associated with some embodiments, and is not intended to limit the present invention.

This illustrative example is directed to a high frame-rate global shutter image sensor that was designed to include a dual-reset branch SAR ADC architecture, in accordance with some embodiments of the present disclosure. High-speed global shutter image sensors are essential in many scientific, industrial and military applications. They also present significant design challenges, not least of which is the fast row time required. As described hereinabove, the row time consists of the row-wise pixel readout into column sample and hold capacitors, followed by ADC conversion, as shown in FIGS. 2A and 2B, for example. Employing a dual-reset branch SAR ADC architecture as described hereinabove (e.g., as shown in FIG. 3) in the high-speed 1.3 Mpix global shutter CMOS image sensor enabled achieving the row time requirements at the maximum frame rate.

The column parallel dual-reset branch SAR ADCs allowed for overlapping the reset sampling phase with the conversion phase. Accordingly, the time previously used (i.e., if using a single-reset branch SAR ADC) for reset sampling was reclaimed for the ADC conversion, and the comparator power was lowered in exchange for a relatively small chip area penalty. Even though the 5T global shutter pixel used does not support direct correlated double sampling (CDS), the low noise analog signal chain allowed for successfully operating using external CDS for a −6 dB noise improvement.

Figure 6:
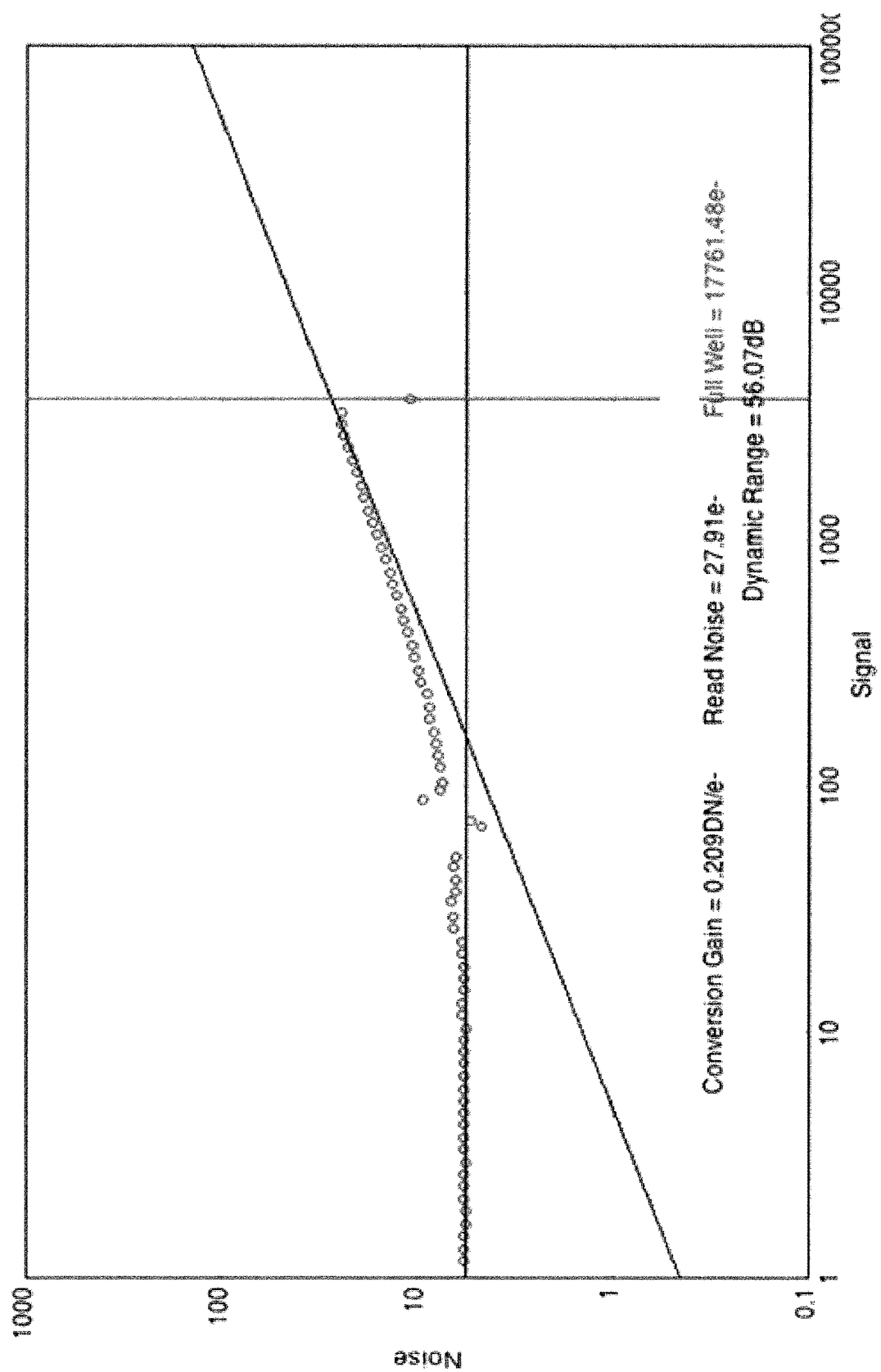
FIG. 6 depicts the measured noise properties for a high frame-rate global shutter image sensor that was designed to include a dual-reset branch SAR ADC architecture, in accordance with some embodiments of the present disclosure.

More specifically, a column parallel 3000 fps 1.3 Mpix global shutter CMOS sensor utilizing a (column parallel) SAR ADC structure corresponding to that shown in FIG. 3 was designed, fabricated, and tested. The 5T global shutter pixel used does not allow for direct CDS, in that the pixel's reset level is not available at the same time as its signal level, leading to a relatively high sensor noise floor of 28 e−, as shown in FIG. 5. However, by capturing a frame of reset levels prior to integration, followed by a frame of signal levels after integration, CDS was accomplished externally. The low noise analog readout allowed for reducing the noise floor to 12.6 e− using external CDS, as seen in FIG. 6.

The present invention has been illustrated and described with respect to some specific embodiments thereof, which embodiments are merely illustrative of some of the principles of some embodiments of the invention and are not intended to be exclusive or otherwise limiting embodiments. Accordingly, although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases the order of process steps may be varied, and various illustrative steps may be combined, altered, or omitted, without changing the purpose, effect or import of the methods described. Similarly, the structure and/or function of a component may be combined into a single component or divided among two or more components. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with the claims that follow.

What is claimed is:

1. An analog-to-digital converter (ADC), comprising:
a comparator having a first input and a second input;
a first-side branch that comprises a binary-weighted capacitor array and that is configured to sample a voltage signal onto the binary-weighted capacitor array, wherein an output from the binary-weighted capacitor array is coupled to the first input of the comparator;
a plurality of second-side branches, each second-side branch configured to sample a respective voltage and having a respective output, and wherein the ADC is configured to selectively couple each of the outputs of the second-side branches separately to the second input of the comparator; and
wherein the plurality of second-side branches are implemented as not more than two second-side branches, the number of second-side branches thereby being two, and further comprising (i) a series of more than two voltage references configured for selective coupling to the binary-weighted capacitor array for selecting two of the voltage references for use in successive approximation control of the binary-weighted capacitor array and in establishing at least one most-significant bit during operation of the ADC, and (ii) control logic that is operable to cause:
sampling a first signal by a first one of the plurality of second-side branches;
sampling a second signal onto the binary-weighted capacitor array;
carrying out, based on the first signal and the second signal, a charge redistribution successive approximation A/D conversion using the binary-weighted capacitor array; and
while carrying out the charge redistribution successive approximation A/D conversion based on the first and second signals, sampling a third signal onto a second one of the plurality of side branches;
wherein the third signal is to be used with a fourth signal sampled onto the binary-weighted capacitor array after carrying out the charge redistribution successive approximation A/D conversion, for carrying out a subsequent charge redistribution successive approximation A/D conversion using the binary-weighted capacitor array based on the third and fourth signals.

2. An image sensor, comprising:
an array of pixels; and
at least one ADC comprising:
a comparator having a first input and a second input;
a first-side branch that comprises a binary-weighted capacitor array and that is configured to sample a voltage signal onto the binary-weighted capacitor array, wherein an output from the binary-weighted capacitor array is coupled to the first input of the comparator;
a plurality of second-side branches, each second-side branch configured to sample a respective voltage and having a respective output, wherein the ADC is configured to selectively couple each of the outputs of the second-side branches separately to the second input of the comparator; and wherein the pixels comprising the array of pixels are organized in rows and columns and the image sensor is configured for parallel readout on a plurality of column buses, wherein each column bus is associated with a respective one of said at least one ADCs, and wherein the number of column buses is greater than the number of said at least one ADC.

3. An image sensor, comprising:

an array of pixels; and at least one analog-to-digital converter (ADC), comprising:
   a comparator having a first input and a second input;
   a first-side branch that comprises a binary-weighted capacitor array and that is configured to sample a voltage signal onto the binary-weighted capacitor array, wherein an output from the binary-weighted capacitor array is coupled to the first input of the comparator;
   a plurality of second-side branches, each second-side branch configured to sample a respective voltage and having a respective output, wherein the ADC is configured to selectively couple each of the outputs of the second-side branches separately to the second input of the comparator; and wherein each ADC further comprises (i) a series of more than two voltage references configured for selective coupling to the binary-weighted capacitor array for selecting two of the voltage references for use in successive approximation control of the binary-weighted capacitor array and in establishing at least one most-significant bit during operation of the ADC, and (ii) control logic that is operable to cause:

sampling a first signal by a first one of the plurality of second-side branches;

sampling a second signal onto the binary-weighted capacitor array;

carrying out, based on the first signal and the second signal, a charge redistribution successive approximation A/D conversion using the binary-weighted capacitor array; and while carrying out the charge redistribution successive approximation A/D conversion based on the first and second signals, sampling a third signal onto a second one of the plurality of side branches;

wherein the third signal is to be used with a fourth signal sampled onto the binary-weighted capacitor array after carrying out the charge redistribution successive approximation A/D conversion for carrying out a subsequent charge redistribution successive approximation A/D conversion using the binary-weighted capacitor array based on the third and fourth signals.

4. The image sensor according to claim 2, wherein for each of the ADCs the first-side branch that comprises a binary-weighted capacitor array is configured to sample a pixel signal corresponding to photocharge generated by a pixel, and each of the plurality of second-side branches is configured to sample a reset voltage signal corresponding to a pixel of the pixel array.

5. An image sensor, comprising:

an array of pixels; and at least one analog-to-digital converter (ADC), comprising:
   a comparator having a first input and a second input;
   a first side branch that comprises a binary weighted capacitor array and that is configured to sample a voltage signal onto the binary weighted capacitor array, wherein an output from the binary weighted capacitor array is coupled to the first input of the comparator;
   a plurality of second side branches, each second side branch configured to sample a respective voltage and having a respective output, wherein the ADC is configured to selectively couple each of the outputs of the second side branches separately to the second input of the comparator;

wherein for each of the ADCs the first-side branch that comprises a binary-weighted capacitor array is configured to sample a pixel signal corresponding to photocharge generated by a pixel, and each of the plurality of second-side branches is configured to sample a reset voltage signal corresponding to a pixel of the pixel array; and wherein the plurality of second-side branches consists of two second-side branches that are configured to sample reset voltage signals from pixels in alternating rows of the pixel array, and wherein the pixels comprising the array of pixels are organized in rows and columns and the image sensor is configured for parallel readout on a plurality of column buses, wherein each column bus is associated with a respective one of said at least one ADCs.

* * * * *